US010096400B2

(12) United States Patent
Ohkubo et al.

(10) Patent No.: US 10,096,400 B2
(45) Date of Patent: Oct. 9, 2018

(54) ELECTRIC WIRE HOLDING MEMBER AND WIRE HARNESS

(71) Applicants: YAZAKI CORPORATION, Tokyo (JP); TOYOTA JIDOSHA KABUSHIKI KAISHA, Toyota-shi, Aichi-ken (JP)

(72) Inventors: Yoshitaka Ohkubo, Shizuoka (JP); Yasuhiro Yamaguchi, Shizuoka (JP); Takaaki Miyajima, Shizuoka (JP); Hajime Kato, Shizuoka (JP); Hiroshi Aihara, Toyota (JP)

(73) Assignees: YAZAKI CORPORATION, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/146,974

(22) Filed: May 5, 2016

(65) Prior Publication Data

US 2016/0365166 A1 Dec. 15, 2016

(30) Foreign Application Priority Data

Jun. 12, 2015 (JP) .................. 2015-119642

(51) Int. Cl.
*H05K 9/00* (2006.01)
*H01B 7/00* (2006.01)
(Continued)

(52) U.S. Cl.
CPC ............ *H01B 7/0045* (2013.01); *H01B 7/17* (2013.01); *H02G 3/04* (2013.01); *H02G 3/0481* (2013.01);
(Continued)

(58) Field of Classification Search
CPC ..................... H05K 9/0098; H01B 7/0045
See application file for complete search history.

(56) References Cited

U.S. PATENT DOCUMENTS 1,856,109 A * 5/1932 Murray ............... H01B 9/0666
138/108
5,027,478 A * 7/1991 Suhr .................... B65H 75/36
137/355.16

(Continued)

FOREIGN PATENT DOCUMENTS

JP 2010-27577 A 2/2010
JP 2012-249506 A 12/2012
JP 2014-72275 * 4/2014

OTHER PUBLICATIONS

Communication dated May 16, 2017, issued by the Japanese Patent Office in counterpart application No. 2015-119642.

*Primary Examiner* — Hung V Ngo
(74) *Attorney, Agent, or Firm* — Sughrue Mion, PLLC

(57) ABSTRACT

An electric wire holding member (20) includes: a main body portion (21) formed in a cylindrical shape having a central axis line (X1); a plurality of electric wire accommodating portions (22a, 22b, and 22c) provided to penetrate through the main body portion (21) along the central axis line (X1), respectively, and are formed to be capable of individually accommodating electric wires (3a, 3b, and 3c), respectively, the electric wire accommodating portions (22a, 22b, and 22c) being disposed along a circumferential direction around the central axis line (X1) at equal intervals in a cross section as viewed from an axial direction; and a space portion (23) formed between two electric wire accommodating portions adjacent to each other along the circumferential direction to penetrate through the main body portion (21) along the central axis line (X1).

11 Claims, 3 Drawing Sheets

(51) Int. Cl.
*H01B 7/17* (2006.01)
*H02G 3/04* (2006.01)

(52) U.S. Cl.
CPC ......... *H05K 9/0086* (2013.01); *H05K 9/0098* (2013.01)

(56) References Cited

U.S. PATENT DOCUMENTS

| | | | | |
|---|---|---|---|---|
| 5,236,227 A | * | 8/1993 | Adams | F16L 39/00 285/27 |
| 5,742,972 A | * | 4/1998 | Bredall | A46B 9/026 15/167.1 |
| 5,742,982 A | * | 4/1998 | Dodd | F16G 11/00 24/16 R |
| 6,943,300 B2 | * | 9/2005 | Ekeberg | H01B 7/045 174/113 C |
| 7,371,967 B2 | * | 5/2008 | MaHoney | H02G 3/30 174/113 R |
| 7,709,739 B2 | * | 5/2010 | Ferragut | H02G 3/0633 174/113 C |
| 2004/0050583 A1 | | 3/2004 | Denton | |
| 2009/0167078 A1 | * | 7/2009 | Watanabe | H01B 7/16 307/10.1 |
| 2009/0272576 A1 | | 11/2009 | Medina | |
| 2013/0233592 A1 | * | 9/2013 | Li | H01B 1/24 174/119 R |
| 2013/0233616 A1 | * | 9/2013 | Okuyama | H02G 15/007 174/652 |
| 2013/0248240 A1 | * | 9/2013 | Glew | H05K 9/0098 174/388 |
| 2014/0061393 A1 | * | 3/2014 | Cripps, II | F16L 3/222 248/55 |
| 2014/0102757 A1 | | 4/2014 | Trifeletti et al. | |
| 2015/0264841 A1 | * | 9/2015 | Yanagihara | H05K 9/0018 174/68.3 |

* cited by examiner

ELECTRIC WIRE HOLDING MEMBER AND WIRE HARNESS

CROSS-REFERENCE TO RELATED APPLICATION(S)

The present application claims priority to and incorporates by reference the entire contents of Japanese Patent Application No. 2015-119642 filed in Japan on Jun. 12, 2015.

BACKGROUND OF THE INVENTION

1. Field of the Invention

The present invention relates to an electric wire holding member and a wire harness.

2. Description of the Related Art

In the related arts, an inverter and a motor are connected to each other by three-phase electric wires and electric power is supplied to the motor from the inverter in vehicles such as hybrid vehicles or electric vehicles. In the three-phase wires, a structure to suppress noise by covering collectively the outer periphery by a single braid, a so-called collective shield structure, has been known (for example, see Japanese Patent Application Laid-open No. 2012-249506).

Meanwhile, in the supply of the electric power from the inverter to the motor, the output from the inverter includes a steep rising voltage. Such a steep rising voltage is repeatedly reflected many times between the inverter and the motor by impedance mismatching. As a result, there is a case that an excessive surge voltage may be applied to the motor. In the collective shield structure according to the related art disclosed in Japanese Patent Application Laid-open No. 2012-249506, for example, there is room for further improvement in suppression of surge voltage.

SUMMARY OF THE INVENTION

The present invention has been made in view of the above circumstances, and an object thereof is to provide an electric wire holding member and a wire harness that can suitably suppress the surge voltage.

In order to achieve the above mentioned object, an electric wire holding member according to one aspect of the present invention includes a main body portion that is formed in a cylindrical shape having a central axis line as an axial center; a plurality of electric wire accommodating portions that are provided to penetrate through the main body portion along the central axis line, respectively, and are formed to be capable of individually accommodating electric wires, respectively, the plurality of electric wire accommodating portions being disposed along a circumferential direction around the central axis line at equal intervals in a cross section as viewed from an axial direction along the central axis line; and a space portion that is formed between two electric wire accommodating portions adjacent to each other along the circumferential direction out of the plurality of electric wire accommodating portions to penetrate through the main body portion along the central axis line.

According to another aspect of the present invention, in the electric wire holding member, it is possible to configure that the electric wire accommodating portions are formed such that outlines of the electric wires to be accommodated in the electric wire accommodating portions at least come in contact with the cylindrical outline of the main body portion from an inner peripheral side in the cross section.

According to still another aspect of the present invention, in the electric wire holding member, it is possible to configure that the electric wire accommodating portions are formed such that the electric wires are capable of being fitted thereinto from an outer peripheral side of the main body portion.

According to still another aspect of the present invention, in the electric wire holding member, it is possible to configure that the space portion is integrally formed including an area from between two electric wire accommodating portions adjacent to each other along the circumferential direction out of the plurality of electric wire accommodating portions to the central axis line in the cross section.

According to still another aspect of the present invention, in the electric wire holding member, it is possible to configure that the electric wire holding member further includes outer edge portions that are erected from a cylindrical outer peripheral surface of the main body portion and are formed to extend along the circumferential direction.

According to still another aspect of the present invention, a wire harness includes an electric wire portion in which three or more electric wires are gathered in the same direction; the electric wire holding member which maintains an arrangement of each electric wire of the electric wire portion around the central axis line; a shield member that collectively encloses an outer peripheral side of the electric wire holding member which holds the electric wire portion; and a protective member that covers the outer peripheral side of the electric wire holding member enclosed by the shield member.

According to still another aspect of the present invention, in the wire harness, it is possible to configure that the electric wire holding member is formed so as to enclose a part of the electric wire portion in a longitudinal direction, and a plurality of electric wire holding members are provided along a longitudinal direction of the electric wire portion at predetermined intervals.

According to still another aspect of the present invention, in the wire harness, it is possible to configure that the electric wire holding member is formed so as to enclose an overall area of the electric wire portion in the longitudinal direction of the electric wire portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
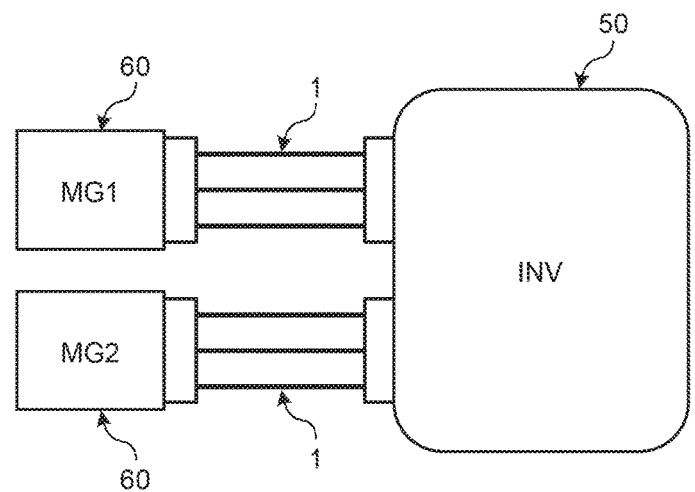
FIG. 1 is a schematic diagram illustrating a configuration in which a motor and an inverter are connected to each other by a wire harness according to an embodiment of the present invention.

An embodiment of an electric wire holding member and a wire harness according to the present invention will be described below with reference to the accompanying drawings. In the following drawings, the same or corresponding elements are denoted as the same reference numerals, and the description thereof will not be repeated.

Figure 2:
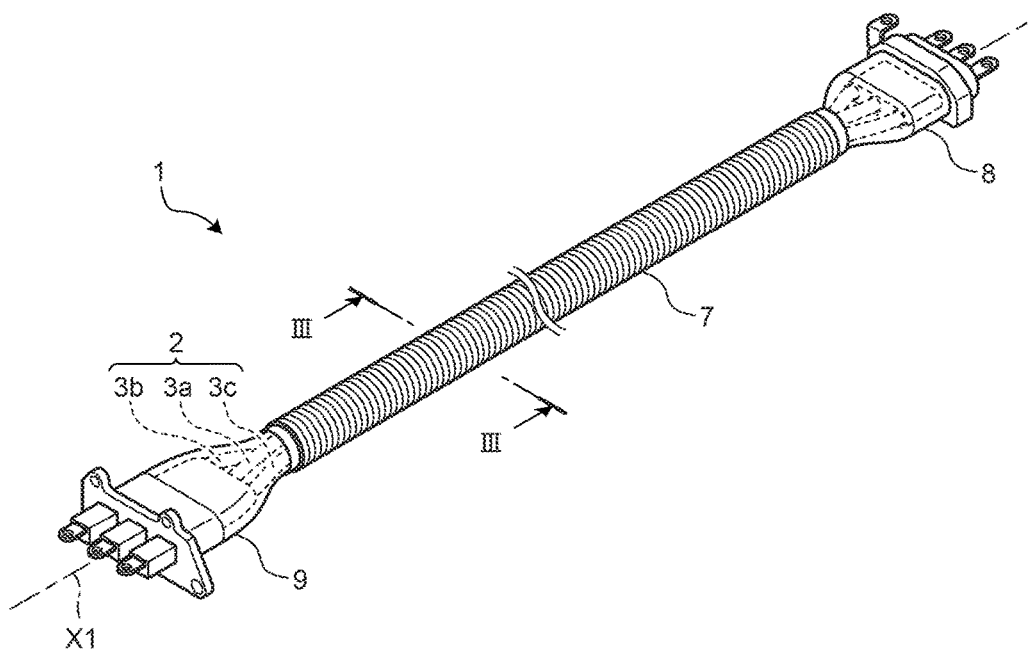
FIG. 2 is a perspective view of the wire harness according to the embodiment of the present invention.
Figure 3:
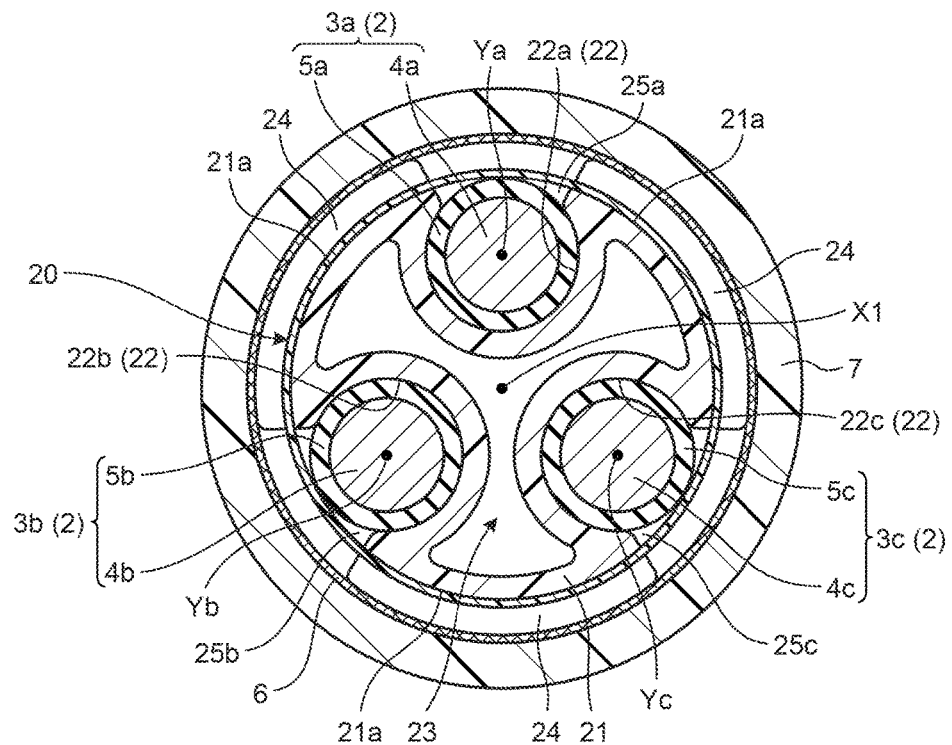
FIG. 3 is a cross-sectional view taken along line III-III in FIGS. 2 and 4 and an axial cross-sectional view of the wire harness according to the embodiment of the present invention.
Figure 4:
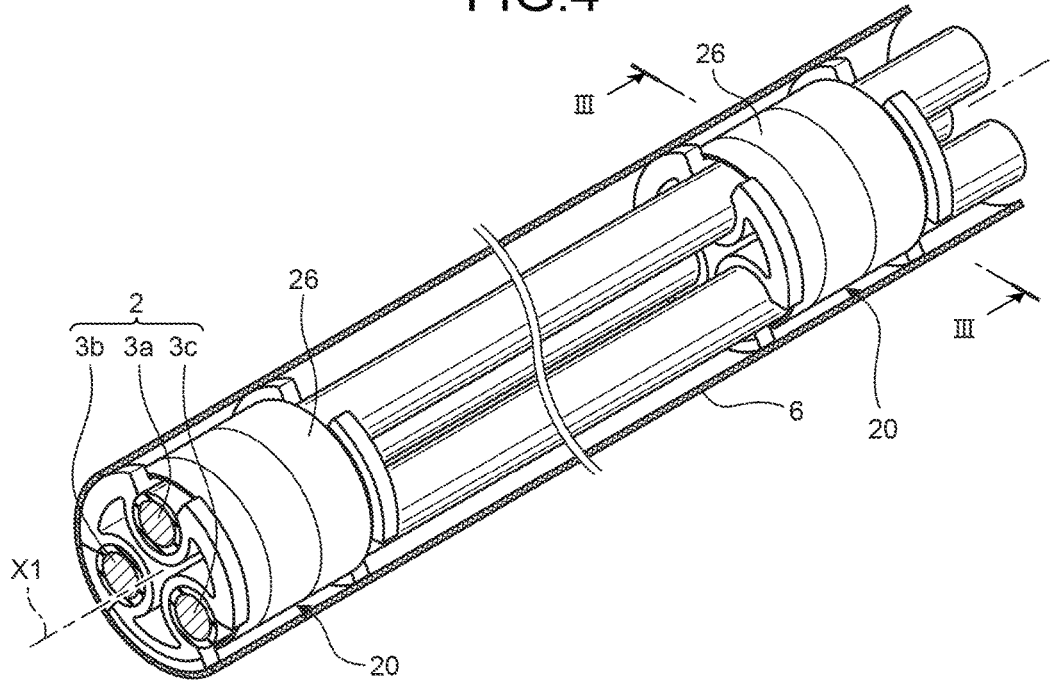
FIG. 4 is a perspective view illustrating a configuration of portions, which is covered with a corrugated tube, in the wire harness illustrated in FIG. 2.
Figure 5:
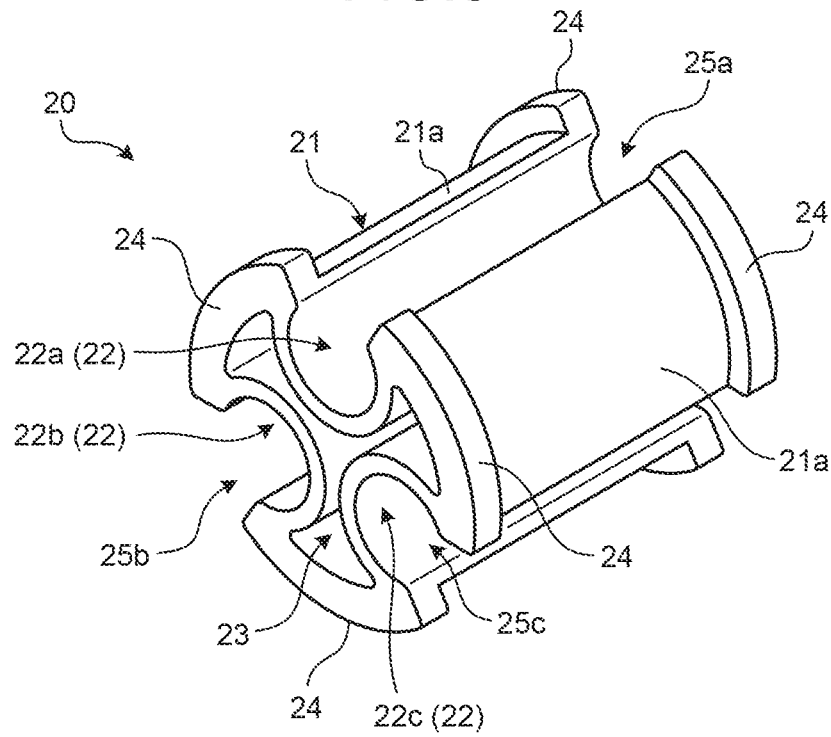
FIG. 5 is a perspective view of an electric wire holding member in FIGS. 3 and 4.

A configuration of an electric wire holding member 20 and a wire harness 1 according to the present embodiment will be described with reference to FIGS. 1 to 5. FIG. 1 is a schematic diagram illustrating a connection configuration of a motor and an inverter through a wire harness according to an embodiment of the present invention. FIG. 2 is a perspective view of the wire harness according to the embodiment of the present invention. FIG. 3 is a cross-sectional view taken along line III-III in FIGS. 2 and 4, and is an axial cross-sectional view of the wire harness according to the embodiment of the present invention. FIG. 4 is a perspective view illustrating a configuration of portions, which is covered with a corrugated tube, in the wire harness illustrated in FIG. 2. FIG. 5 is a perspective view of an electric wire holding member in FIGS. 3 and 4.

An inverter 50 ("INV" in FIG. 1) and a motor 60 ("MG1" and "MG2" in FIG. 1) illustrated in FIG. 1 are mounted on a vehicle such as a hybrid vehicle or an electric vehicle. The inverter 50 is a device that converts a DC output from a power source (not illustrated) mounted on the vehicle to a three-phase AC output. The inverter 50 may output a PWM waveform, and may output a sine waveform. The motor 60 is a device that is driven by the three-phase AC output from the inverter 50, and is a three-phase motor with a Y-connection, for example.

The wire harness 1 according to the present embodiment can be used as a power supply line that is configured to connect the inverter 50 and the motor 60, which are a three-phase AC type as described above, to each other. The wire harness 1 is a three-phase electric wire made of an electric wire group of a three-phase three-wire system that supplies three-phase AC power using three electric wires 3a, 3b, and 3c (see FIGS. 2 to 4).

As illustrated in FIG. 2, the wire harness 1 is configured such that an inverter-side connector 8 and a motor-side connector 9 to be respectively coupled to the inverter 50 and the motor 60 are connected to both terminals of an electric wire portion 2, in which three electric wires 3a, 3b, and 3c are gathered in the same direction. In addition, as illustrated in FIGS. 2 to 4, the wire harness 1 is configured in such a manner that an outer peripheral side of the electric wire portion 2 is covered by tubular braid wire 6 (shield member) and corrugated tube 7 (protective member). Furthermore, the wire harness 1 is configured in such a manner that each of the electric wires 3a, 3b, and 3c of the electric wire portion 2 is held from an inner peripheral side by the electric wire holding member 20.

As illustrated in FIGS. 3 and 4, three electric wires 3a, 3b, and 3c of the electric wire portion 2 extend along a predetermined central axis line X1, and are disposed along a circumferential direction around the central axis line X1 at equal intervals. Three electric wires 3a, 3b, and 3c are non-shielded-type electric wires, respectively, and include conductors 4a, 4b, and 4c having a circular cross-section and insulation portions 5a, 5b, and 5c that are formed by covering the outer periphery of the conductors 4a, 4b, and 4c, respectively. That is, the shape of the electric wires 3a, 3b, and 3c is a substantially circular shape in a cross section of the wire harness 1 as viewed from the axial direction along the central axis line X1 illustrated in FIG. 4 (axial cross section, that is, a cross section perpendicular to the central axis line X1). The conductors 4a, 4b, and 4c of the electric wires 3a, 3b, and 3c are made up of, for example, strand wires or rod-shaped single core wires, respectively, the strand wire being formed in such a manner that a plurality of element wires made of a metal (an aluminum alloy, a copper alloy, or the like) are spirally twisted. The insulation portions 5a, 5b, and 5c of the electric wires 3a, 3b, and 3c are formed by, for example, a synthetic resin, respectively.

The electric wires 3a, 3b, and 3c of the electric wire portion 2 are disposed such that respective central axes (center of gravity) Ya, Yb, and Yc thereof form a substantially equilateral triangle in the axial cross section illustrated in FIG. 3, such as a so-called triangular shape. In addition, the three electric wires 3a, 3b, and 3c are disposed such that two electric wires adjacent to each other in the circumferential direction around the central axis line X1 take a gap depending on the electric wire holding member 20 to be described below without coming in contact with each other. The conductor 4a, 4b, and 4c and the insulation portion 5a, 5b, and 5c of the electric wires 3a, 3b, and 3c have flexibility, respectively, so that the electric wire portion 2 is bendably deformed.

The electric wire holding member 20 is a holding member which maintains an arrangement of each electric wire 3a, 3b, and 3c of the electric wire portion 2 around the central axis line X1. The electric wire holding member 20 is configured to accommodate and hold each of the electric wires 3a, 3b, and 3c of the electric wire portion 2 therein as illustrated in FIGS. 3 and 4, so that a positional relation between the electric wires 3a, 3b, and 3c of the electric wire portion 2 can be appropriately maintained. The electric wire holding member 20 is integrally molded by a synthetic resin, for example. A material of the electric wire holding member 20 is preferably a low dielectric constant material.

As illustrated in FIGS. 3 and 5, the electric wire holding member 20 includes a main body portion 21, a plurality of electric wire accommodating portions 22 (22a, 22b, and 22c), a space portion 23, and outer edge portions 24.

The main body portion 21 is a member that is formed in a cylindrical shape having the central axis line X1 as an axial center. The main body portion 21 includes an outer peripheral surface 21a around the central axis line X1. The outer peripheral surface 21a is divided into a plurality of parts along the circumferential direction around the central axis line X1 by the plurality of electric wire accommodating portions 22. In the present embodiment, the outer peripheral surface 21a of the main body portion 21 is divided into three parts along the circumferential direction by three electric wire accommodating portions 22a, 22b, and 22c.

The plurality of electric wire accommodating portions 22 penetrate through the main body portion 21 along the central axis line X1, respectively, and are formed such that the electric wires 3a, 3b, and 3c of the electric wire portion 2 can be individually accommodated, respectively. Each of the electric wire accommodating portions 22 is disposed along the circumferential direction around the central axis line X1 at an equal interval in the cross section (axial cross section) as viewed from the axial direction along the central axis line X1 illustrated in FIG. 3. The number of electric wire accommodating portions 22 is equal to the number of electric wires included in the electric wire portion 2, and in the present embodiment, three electric wire accommodating portions 22a, 22b, and 22c penetrate through the main body portion 21 along the central axis line X1 and are formed such that the electric wires 3a, 3b, and 3c of the electric wire portion 2 can be individually accommodated, respectively. In addition, three electric wire accommodating portions 22a, 22b, and 22c are disposed along the circumferential direction around the central axis line X1 at equal intervals in the cross section as viewed from the axial direction along the central axis line X1. That is, in the same way as each of the electric wires 3a, 3b, and 3c of the electric wire portion 2, the electric wire accommodating portions 22a, 22b, and 22c are disposed in a triangular shape. The electric wires 3a, 3b, and 3c are individually accommodated in the electric wire accommodating portions 22a, 22b, and 22c disposed in this way, and thus it is possible to hold the electric wire portion 2 while maintaining appropriately the positional relation between the electric wires 3a, 3b, and 3c of the electric wire portion 2.

The electric wire accommodating portions 22a, 22b, and 22c are formed such that outlines of the electric wires 3a, 3b, and 3c to be accommodated in the electric wire accommodating portions at least come in contact with the cylindrical outline of the main body portion 21 from an inner peripheral side in the axial cross section illustrated in FIG. 3. More specifically, the electric wire accommodating portions 22a, 22b, and 22c are formed such that the outline of each of the electric wires 3a, 3b, and 3c to be accommodated in the electric wire accommodating portions 22a, 22b, and 22c touches the outline of the outer peripheral surface 21a of the main body portion 21 from an inner side (central axis line X1 side) in the axial cross section illustrated in FIG. 3. With this configuration, in a state where the electric wires 3a, 3b, and 3c are accommodated in the electric wire accommodating portions 22a, 22b, and 22c, the outer peripheral surface on the outermost peripheral side of the electric wires 3a, 3b, and 3c can be disposed on the same outer peripheral surface as the outer peripheral surface 21a of the main body portion 21, and a tape 26 can be easily wound onto the outer peripheral surface 21a. As illustrated in FIG. 4, the electric wires 3a, 3b, and 3c are accommodated in the electric wire accommodating portions 22a, 22b, and 22c, and the tape 26 is wound onto the outer peripheral surface 21a of the main body portion 21, so that the electric wires 3a, 3b, and 3c of the electric wire portion 2 can be fixed to the electric wire holding member 20.

Furthermore, the electric wire accommodating portions 22a, 22b, and 22c are formed such that the electric wires 3a, 3b, and 3c can be fitted thereinto from the outer peripheral side of the main body portion 21. As illustrated in FIG. 5, the electric wire accommodating portions 22a, 22b, and 22c include openings 25a, 25b, and 25c that are formed on the outer peripheral surface 21a of the main body portion 21 over an overall area of the main body portion 21 along the direction of the central axis line X1. That is, the electric wire accommodating portions 22a, 22b, and 22c extend on the outer peripheral surface 21a in the direction of the central axis line X1 and are formed as a groove having an arc-shaped cross section. In addition, the electric wire accommodating portions 22a, 22b, and 22c are formed such that the inner peripheral surface thereof has a radius of curvature equal to a radius of a circular cross section of each of the electric wires 3a, 3b, and 3c to be accommodated. That is, as illustrated in FIG. 3, the outer peripheral surface of the electric wires 3a, 3b, and 3c abuts onto the inner peripheral surface of the electric wire accommodating portions 22a, 22b, and 22c in the state where the electric wires 3a, 3b, and 3c are accommodated in the electric wire accommodating portions 22a, 22b, and 22c, and the electric wire accommodating portions 22a, 22b, and 22c and the electric wires 3a, 3b, and 3c are concentrically disposed in the axial cross section illustrated in FIG. 3. With this configuration, the electric wire accommodating portions 22a, 22b, and 22c are configured such that the electric wires 3a, 3b, and 3c can be fitted thereinto from the openings 25a, 25b, and 25c formed on the outer peripheral surface 21a of the main body portion 21.

Opening widths of the openings 25a, 25b, and 25c of the electric wire accommodating portions 22a, 22b, and 22c in the circumferential direction are set to be smaller than diameters of the circular cross sections of the electric wires 3a, 3b, and 3c, and thus the electric wires 3a, 3b, and 3c are preferably configured to be hardly pulled out from the state where the electric wires 3a, 3b, and 3c are accommodated in the electric wire accommodating portions 22a, 22b, and 22c.

The space portion 23 is a through-hole portion which is divided from the plurality of electric wire accommodating portions 22a, 22b, and 22c and is formed to penetrate through the main body portion 21 along the central axis line X1. In the axial cross section illustrated in FIG. 3, the space portion 23 is integrally formed including an area from between two electric wire accommodating portions adjacent to each other in the circumferential direction around the central axis line X1 out of the plurality of electric wire accommodating portions 22a, 22b, and 22c to the central axis line X1. In other words, the space portion 23 is radially formed in three directions so as to reach a back of the outer peripheral surface 21a through gaps between the electric wire accommodating portions 22a, 22b, and 22c from the central axis line X1 in the axial cross section illustrated in FIG. 3. When such a space portion 23 is provided, the plurality of electric wire accommodating portions 22a, 22b, and 22c are disposed to have a gap without coming in contact with each other in the circumferential direction around the central axis line X1.

The outer edge portions 24 are erected from the cylindrical outer peripheral surface of the main body portion 21 and are formed to extend along the circumferential direction. In the present embodiment, the outer edge portions 24 are provided at both ends in the axial direction of the main body portion 21. The outer edge portion 24 functions as an outer shape holding portion that comes in contact with the braid wire 6 and the corrugated tube 7 to hold the outer shape of the corrugated tube 7 in a circle when the braid wire 6 and the corrugated tube 7 are sheathed around the electric wire holding member 20.

With respect to the electric wire holding member 20 having such a configuration, in the wire harness 1 according to the present embodiment, a plurality of electric wire holding members 20 are provided at predetermined intervals along the extending direction (direction of the central axis line X1) of each of the electric wires 3a, 3b, and 3c of the electric wire portion 2 as illustrated in FIG. 4. Each of the electric wire holding members 20 is set to have a length of the extent that a dimension thereof in the direction of the central axis line X1 can enclose a part of the electric wire portion 2 in a longitudinal direction.

The braid wire 6 is formed in such a manner that element wires made of a metal (for example, made of a copper metal) are braided in a net-like form, and has a tubular shape as a whole. The braid wire 6 is intended to serve as a shield member that collectively encloses the outer peripheral side of the electric wire portion 2 to suppress noise. In the present embodiment, the braid wire 6 is configured to cover along the outer periphery of the electric wire holding member 20 in the state where each of the electric wires of the electric wire portion 2 is held therein. The braid wire 6 is stretchable by flexibility of the element wires and can be bendably deformed in a free manner together with the electric wire portion 2.

The corrugated tube 7 is made of a synthetic resin, and is formed in a bellows shape, for example. Thus, it can be elastically deformed in a free manner and can be excellently held in a cylindrical shape by elastic restoring force. The corrugated tube 7 is formed such that the electric wire portion 2, the electric wire holding member 20, and the braid wire 6 can be accommodated in the inside of the cylindrical shape thereof, and thus it is configured to cover the outer peripheral side of electric wire portion 2, whereby the electric wires can be protected.

The wire harness 1 having the configuration as described above can be assembled by the following procedures, for example. As illustrated in FIG. 4, first, the plurality of electric wire holding members 20 are disposed along the predetermined central axis line X1 at predetermined intervals, and each of the electric wires 3a, 3b, and 3c is fitted into each of the electric wire accommodating portions 22a, 22b, and 22c provided in each of the electric wire holding members 20. Next, the tape 26 is wound around the outer peripheral surface 21a of the main body portion 21, and thus each of the electric wires 3a, 3b, and 3c of the electric wire portion 2 is fixed to the electric wire holding member 20. Thus, the positional relation between the electric wires 3a, 3b, and 3c of the electric wire portion 2 is appropriately held.

Then, the braid wire 6 is covered on the outer peripheral side of the electric wire portion 2 held in the electric wire holding member 20, and the corrugated tube 7 is attached to the outer periphery of the braid wire 6 as illustrated in FIGS. 2 and 3. At this time, as illustrated in FIG. 3, the outer edge portion 24 of the electric wire holding member 20 abuts on the braid wire 6 and the corrugated tube 7 from the inner peripheral side, and thus the outer shape of the corrugated tube 7 is held in a circular shape. Thereafter, connectors 8 and 9 are connected to both ends of the electric wire portion 2, and the wire harness 1 is assembled.

Next, the effect of the electric wire holding member 20 and the wire harness 1 according to the present embodiment will be described.

Figure 6:
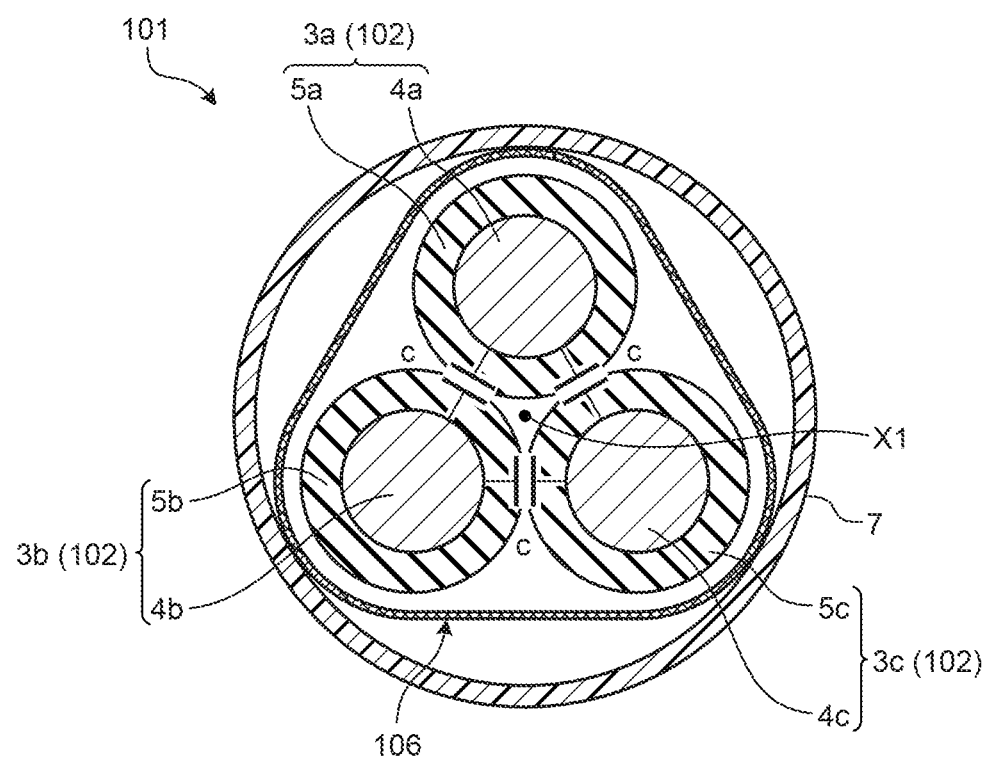
FIG. 6 is an axial cross-sectional view of a wire harness for describing a collective shield structure of a wire harness according to the related art.

Referring now to FIG. 6, a collective shield structure of a wire harness 101 according to the related art will be described as a comparative example. FIG. 6 is an axial cross-sectional view of a wire harness for describing the collective shield structure of the wire harness according to the related art.

As illustrated in FIG. 6, similarly to the wire harness 1 according to the present embodiment, the wire harness 101 according to the related art includes an electric wire portion 102, a braid wire 106, and a corrugated tube 7.

The electric wire portion 102 includes three electric wires 3a, 3b, and 3c similar to those of the electric wire portion 2 of the wire harness 1 according to the present embodiment. The electric wires 3a, 3b, and 3c are disposed in a triangular shape in the axial cross section illustrated in FIG. 6. In addition, the electric wires 3a, 3b, and 3c are configured such that two electric wires adjacent to each other in a circumferential direction around a central axis line X1 can come in contact with each other. The conductors 4a, 4b, and 4c and insulation portions 5a, 5b, and 5c constituting the electric wires 3a, 3b, and 3c have the same material and properties as those of the wire harness 1 according to the present embodiment.

The braid wire 106 is formed in a cylindrical shape with the same material and properties as the braid wire 6 of the wire harness 1 according to the present embodiment, and collectively encloses an outer peripheral side of the electric wire portion 102, similarly to the braid wire 6.

When such a wire harness 101 is connected between the inverter 50 and the motor 60 and a power supply is performed (see FIG. 1), since a distance between the electric wires 3a, 3b, and 3c of the electric wire portion 102 becomes closer to the extent that the electric wires can come in contact with each other, capacitance "c" between the electric wires 3a, 3b, and 3c increases and noise is easily generated in the electric wires 3a, 3b, and 3c. Furthermore, since the distance between the electric wires 3a, 3b, and 3c becomes closer, each of the electric wires 3a, 3b, and 3c is susceptible to noise generated in another neighboring electric wire. For this reason, when the noise is generated in each of the electric wires 3a, 3b, and 3c, radiation noise of the electric wire portion 102 tends to increase. As a result, an excessive surge voltage might occur.

In contrast, the wire harness 1 according to the present embodiment includes the electric wire portion 2 in which three electric wires 3a, 3b, and 3c are gathered in the same direction, the electric wire holding member 20 which maintains an arrangement of each electric wire 3a, 3b, and 3c of the electric wire portion 2 around the central axis line X1, the braid wire 6 that collectively encloses the outer peripheral side of the electric wire holding member 20 which holds the electric wire portion 2, and the corrugated tube 7 that covers the outer peripheral side of the electric wire holding member 20 enclosed by the braid wire 6.

The electric wire holding member 20 according to the present embodiment includes the main body portion 21 that is formed in the cylindrical shape having the central axis line X1 as an axial center, the plurality of electric wire accommodating portions 22a, 22b, and 22c that are provided to penetrate through the main body portion 21 along the central axis line X1, respectively, and are formed to be capable of individually accommodating the electric wires 3a, 3b, and 3c of the electric wire portion 2, respectively, the plurality of electric wire accommodating portions being disposed along the circumferential direction around the central axis line X1 at equal intervals in the cross section as viewed from the axial direction along the central axis line X1 as illustrated in FIG. 3, and the space portion 23 that is formed between two electric wire accommodating portions adjacent to each other along the circumferential direction out of the plurality of electric wire accommodating portions 22a, 22b, and 22c to penetrate through the main body portion 21 along the central axis line X1.

With this configuration, since the space portion 23 is necessarily interposed between the electric wire accommodating portions 22a, 22b, and 22c of the electric wire holding member 20 along the circumferential direction, when each of the electric wires 3a, 3b, and 3c of the electric wire portion 2 is accommodated in each of the electric wire accommodating portions 22a, 22b, and 22c of the electric wire holding member 20, the distance between the electric wires of the electric wire portion 2 can be ensured by a dimension in the circumferential direction of the space portion 23. For this reason, as compared with the wire harness 101 according to the related art, since the distance between the electric wires 3a, 3b, and 3c of the electric wire portion 2 can be enlarged, the capacitance "c" between the electric wires 3a, 3b, and 3c of the electric wire portion 2 can be reduced, the noise generation in the electric wires 3a, 3b, and 3c can be suppressed, and the influence of the noise generated in another neighboring electric wire can be also reduced. In addition, when the space portion 23 is provided between the electric wire accommodating portions 22a, 22b, and 22c, since an air layer having a low dielectric constant can be provided between the electric wires 3a, 3b, and 3c to be accommodated in the electric wire accommodating portions 22a, 22b, and 22c, the capacitance "c" between the electric wires 3a, 3b, and 3c can be further reduced. Therefore, according to the wire harness 1 and the electric wire holding member 20 of the present embodiment, the radiation noise of the electric wire portion 2 can be sufficiently reduced, and, as a result, the occurrence of the surge voltage can be suitably suppressed.

Furthermore, the electric wire holding member 20 of the present embodiment can suitably maintain the appropriate positional relation between the electric wires 3a, 3b, and 3c of the electric wire portion 2, the positional relation which can suitably suppress the occurrence of the surge voltage as described above, by accommodating each of the electric wires 3a, 3b, and 3c of the electric wire portion 2 in each of the electric wire accommodating portions 22a, 22b, and 22c. Accordingly, the electric wire holding member 20 according to the present embodiment can allow continuous effect for a long period of suppressing the surge voltage in the wire harness 1, in which the electric wire holding member 20 is incorporated.

Furthermore, in the electric wire holding member 20 according to the present embodiment, the electric wire accommodating portions 22a, 22b, and 22c are formed such that the outlines of the electric wires 3a, 3b, and 3c to be accommodated in the electric wire accommodating portions 22a, 22b, and 22c touch the cylindrical outline of the main body portion 21 (outline of the outer peripheral surface 21a) from the inner peripheral side in the axial cross section illustrated in FIG. 3.

With this configuration, since the electric wires 3a, 3b, and 3c accommodated in the electric wire accommodating portions 22a, 22b, and 22c can be disposed separately from the central axis line X1 as much as possible to the outer peripheral direction within the constraint range of the cylindrical shape of the main body portion 21, the distance in the circumferential direction between the electric wires 3a, 3b, and 3c of the electric wire portion 2 can be enlarged as much as possible. Thus, the capacitance "c" between the electric wires 3a, 3b, and 3c of the electric wire portion 2 can be further reduced, and the occurrence of the surge voltage can be further suppressed.

In addition, when each of the electric wires 3a, 3b, and 3c of the electric wire portion 2 is accommodated in each of the electric wire accommodating portions 22a, 22b, and 22c of the electric wire holding member 20, since the electric wires 3a, 3b, and 3c do not protrude from the outer peripheral surface 21a of the main body portion 21 of the electric wire holding member 20, the tape 26 can be easily wound around the outer peripheral surface 21a. As long as the electric wires 3a, 3b, and 3c to be accommodated in the electric wire accommodating portions 22a, 22b, and 22c do not protrude from the outer edge portion 24, it may protrude to the outer peripheral side from the outer peripheral surface 21a of the main body portion 21.

Furthermore, in the electric wire holding member 20 according to the present embodiment, the electric wire accommodating portions 22a, 22b, and 22c are formed such that the electric wires 3a, 3b, and 3c can be fitted thereinto from the outer peripheral side of the main body portion 21. That is, the electric wires 3a, 3b, and 3c can be fitted into the electric wire accommodating portions 22a, 22b, and 22c from the openings 25a, 25b, and 25c provided on the outer peripheral surface 21a of the main body portion 21. With this configuration, the electric wires 3a, 3b, and 3c can be easily accommodated in the electric wire accommodating portions 22a, 22b, and 22c, and assembling workability of the electric wire portion 2 to the electric wire holding member 20 can be improved.

In the electric wire holding member 20 according to the present embodiment, furthermore, the space portion 23 is integrally formed including the area from between two electric wire accommodating portions out of the plurality of electric wire accommodating portions 22a, 22b, and 22c which are adjacent to each other in the circumferential direction to the central axis line X1, in the axial cross section illustrated in FIG. 3.

With this configuration, since the air layers can be provided much more between the electric wires 3a, 3b, and 3c to be accommodated in the electric wire accommodating portions 22a, 22b, and 22c, the capacitance "c" between the electric wires 3a, 3b, and 3c can be further reduced. In addition, since the main body portion 21 of the electric wire holding member 20 has a hollow shape, it can be flexibly deformed with ease against external force and can be improved in shock absorbing properties.

Furthermore, the electric wire holding member 20 according to the present embodiment includes the outer edge portions 24 that are erected from the cylindrical outer peripheral surface 21a of the main body portion 21 and are formed to extend along the circumferential direction. With this configuration, the outer edge portion 24 abuts onto the inner peripheral surface of the braid wire 6 and the corrugated tube 7 when the braid wire 6 and the corrugated tube 7 are sheathed around the electric wire holding member 20, and thus the outer shape of the corrugated tube 7 can be firmly held in a circular shape along the outer shape of the outer edge portion 24.

In the wire harness 1 according to the present embodiment, furthermore, the electric wire holding member 20 is formed so as to enclose a part of the electric wire portion 2 in the longitudinal direction, and the plurality of electric wire holding members are provided along the longitudinal direction of the electric wire portion 2 at predetermined intervals. With this configuration, since the part of the electric wire portion 2 enclosed by the electric wire holding member 20 is narrowed in the longitudinal direction, it is possible to maintain the flexibility (bending easiness) of the electric wire portion 2 which is not enclosed by the electric wire holding member 20. Thus, the wire harness 1 according to the present embodiment can excellently maintain the flexibility of the electric wire portion 2 while exhibiting the effect of reducing the surge voltage due to the installation of the electric wire holding member 20.

The embodiment of the present invention is described above. It should be understood that the present embodiment is in all respects illustrative and is not intended to limit the technical scope of the present invention. The described embodiment can be performed in other various forms, various kinds of removals, replacements and modifications may be possible without departing from the spirit of the present invention. The embodiment and the modification are intended to be embraced in the range and gist of the present invention, and are intended to be embraced in the invention disclosed in the range of the claims and the equivalency thereof.

The above embodiment exemplifies the configuration in which the wire harness 1 includes the plurality of electric wire holding members 20 and each of the electric wire holding members 20 is formed to enclose the part of the electric wire portion 2 in the longitudinal direction as illustrated in FIG. 4, but the configuration of the electric wire holding member 20 is not limited thereto. For example, the wire harness 1 includes a single electric wire holding member 20, and this electric wire holding member 20 may be formed to enclose the overall area of the electric wire portion 2 in the longitudinal direction. With this configuration, since a contact area between the electric wire holding member 20 and the electric wire portion 2 can be increased, the arrangement of each of the electric wires 3a, 3b, and 3c of the electric wire portion 2, whereby the occurrence of the surge voltage can be suitably suppressed, can be more firmly held, and the effect of suppressing the surge voltage of the wire harness 1 can be continued for a longer period.

Furthermore, the above embodiment exemplifies the configuration in which the electric wires 3a, 3b, and 3c are fitted into the electric wire accommodating portions 22a, 22b, and 22c of the electric wire holding member 20 from the openings 25a, 25b, and 25c provided in the outer peripheral surface 21a of the main body portion 21, respectively, but the openings 25a, 25b, and 25c may not be provided. In this case, each of the electric wire accommodating portions 22a, 22b, and 22c becomes a circular hole shape, and is opened at both end faces of the main body portion 21 in the axial direction.

Although the above embodiment exemplifies the inverter 50 and the motor 60 as two elements to be connected by the wire harness 1 according to the embodiment, as long as the surge voltage may occur between two elements, the wire harness 1 can be also applied between other elements.

Furthermore, although the above embodiment exemplifies the configuration in which the wire harness 1 according to the embodiment is employed as a power supply line that is configured to connect the inverter 50 and the motor 60, which are a three-phase AC type, the inverter 50 and the motor 60 may not be the three-phase AC type. That is, the wire harness 1 according to the embodiment may be other than three-phase wiring, for example, four-phase wiring, and the electric wire portion 2 may be configured to have three or more electric wires.

Furthermore, although the above embodiment exemplifies the braid wire 6 as an example of the shield member for suppressing the noise, for example, a metal tape or foil such as copper or aluminum may be applied as the shield member and may be configured as the shield member in combination with the braid wire 6.

In addition, each of the electric wires of the electric wire portion 2 may be a coaxial cable. That is, the shield member may be individually provided around the conductor of each electric wire and for each electric wire between the conductor and the covering portion.

In addition, although the above embodiment exemplifies the configuration in which the braid wire 6 as the shield member is grounded, the braid wire 6 may be configured not to be grounded.

According to the present invention, since the distance between the electric wires to be accommodated in the electric wire accommodating portions can be enlarged, the noise generation between the electric wires can be suppressed, and the influence of the noise generated in another neighboring electric wire can be also reduced. In addition, the electric wires are accommodated in the electric wire accommodating portions, and thus an appropriate positional relation between the electric wires can be suitably maintained. This makes it possible to sufficiently reduce the radiation noise of the electric wires, and as a result, the effect capable of suitably suppressing the surge voltage is achieved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A wire harness comprising:
an electric wire holding member including a main body portion that is formed in a cylindrical shape having a central axis line as an axial center and includes an outer peripheral surface about the central axis line; a plurality of electric wire accommodating portions that are provided to penetrate through the main body portion along the central axis line, respectively, and are formed to be capable of individually accommodating electric wires, respectively, the plurality of electric wire accommodating portions being disposed along a circumferential direction around the central axis line at equal intervals in a cross section as viewed from an axial direction along the central axis line;
a space portion that is a void formed in a gap between two electric wire accommodating portions adjacent to each other along the circumferential direction out of the plurality of electric wire accommodating portions to penetrate through the main body portion along the central axis line; and
at least two outer edge portions erected from opposite ends of a cylindrical outer peripheral surface of the main body portion and formed to extend along the circumferential direction, wherein the space portion radially extends to a back of the outer peripheral surface through a gap between the adjacent electric wire accommodating portions from the central axis line and is closed by the outer peripheral surface,
an electric wire portion in which three or more electric wires are gathered in the same direction and an arrangement of each electric wire of the electric wire portion around the central axis line is maintained by the electric wire holding member,
a tape that is wound onto the outer peripheral surface of the main body portion so that the electric wires of the electric wire portion are fixed to the electric wire holding member, and
a protective member that covers an outer peripheral side of the electric wire holding member in a state the electric wires of the electric wire portion are fixed to electric wire holding member by the tape.

2. The wire harness according to claim 1, wherein
the electric wire accommodating portions are formed such that outlines of the electric wires to be accommodated in the electric wire accommodating portions at least come in contact with the cylindrical outline of the main body portion from an inner peripheral side in the cross section.

3. The wire harness according to claim 1, wherein
the electric wire accommodating portions are formed such that the electric wires are capable of being fitted thereinto from an outer peripheral side of the main body portion.

4. The wire harness according to claim 1, wherein the space portion is integrally formed including an area from between two electric wire accommodating portions adjacent to each other along the circumferential direction out of the plurality of electric wire accommodating portions to the central axis line in the cross section.

5. The wire harness according to claim 1 comprising:

a shield member that collectively encloses the outer peripheral side of the electric wire holding member which holds the electric wire portion; wherein the protective member covers the outer peripheral side of the electric wire holding member enclosed by the shield member.

6. The wire harness according to claim 5, wherein the electric wire holding member is formed so as to enclose a part of the electric wire portion in a longitudinal direction, and a plurality of electric wire holding members are provided along a longitudinal direction of the electric wire portion at predetermined intervals.

7. The wire harness according to claim 5, wherein the electric wire holding member is formed so as to enclose an overall area of the electric wire portion in the longitudinal direction of the electric wire portion.

8. The wire harness according to claim 5, wherein the shield member contacts only the at least two outer edge portions of the main body portion in an assembled state.

9. The wire harness according to claim 1, wherein the space portion includes a plurality of space portions that are each a void formed in a gap between each two electric wire accommodating portions adjacent to each other along the circumferential direction of the plurality of electric wire accommodating portions to penetrate through the main body portion along the central axis line.

10. The wire harness according to claim 9, wherein the plurality of space portions are in communication with one another.

11. The wire harness according to claim 1, further comprising:

the tape is provided entirely between the at least two outer edge portions.

* * * * *